United States Patent
Matsumura et al.

(10) Patent No.: US 8,063,391 B2
(45) Date of Patent: Nov. 22, 2011

(54) LIGHT-TRANSMITTING ELECTROMAGNETIC WAVE-SHIELDING MATERIAL

(75) Inventors: Takatoshi Matsumura, Tokyo (JP); Masahiko Ishikawa, Tokyo (JP); Yoshitaka Masuda, Tokyo (JP); Noboru Ohtani, Tokyo (JP); Yoshiya Kimura, Tokyo (JP); Yoshiyuki Masuda, Tokyo (JP); Noriyuki Kato, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 447 days.

(21) Appl. No.: 12/155,404

(22) Filed: Jun. 3, 2008

(65) Prior Publication Data

US 2008/0302981 A1    Dec. 11, 2008

(30) Foreign Application Priority Data

Jun. 5, 2007   (JP) ................. 2007-148999

(51) Int. Cl.
*G02B 5/20* (2006.01)

(52) U.S. Cl. .............. 250/515.1; 428/220; 349/96
(58) Field of Classification Search .......... 250/515.1
See application file for complete search history.

(56) References Cited

U.S. PATENT DOCUMENTS

| 5,073,012 | A | * | 12/1991 | Lynam | 359/265 |
| 5,910,854 | A | * | 6/1999 | Varaprasad et al. | 359/273 |
| 7,371,450 | B2 | * | 5/2008 | Arakawa et al. | 428/138 |
| 7,738,746 | B2 | * | 6/2010 | Charters et al. | 385/13 |
| 2007/0243364 | A1 | * | 10/2007 | Maekawa et al. | 428/220 |
| 2008/0117509 | A1 | * | 5/2008 | Hayashi et al. | 359/486 |

FOREIGN PATENT DOCUMENTS

| JP | 10-041682 A | 2/1998 |
| JP | 10-335884 A | 12/1998 |
| JP | 2006-157040 A | 6/2006 |
| JP | 2006-319251 A | 11/2006 |

* cited by examiner

*Primary Examiner* — Phillip A Johnston
(74) *Attorney, Agent, or Firm* — Foley & Lardner LLP

(57) ABSTRACT

The present invention provides a light-transmitting electromagnetic wave-shielding material for use in displays or in-vehicle panels each having a polarizing plate or a retardation plate, wherein the light-transmitting electromagnetic wave-shielding material undergoes no generation of light interference fringes and is satisfactory in visibility even through sunglasses, goggles, glare-proof panels or glare-proof window materials having polarizing capability. By using unstretched light-transmitting organic polymer materials low in molecular orientation or small in molecular orientation unevenness as the base substrate of an electromagnetic wave-shielding layer, the light-transmitting electromagnetic wave-shielding material excellent in light interference fringe prevention capability can be obtained.

6 Claims, No Drawings

LIGHT-TRANSMITTING ELECTROMAGNETIC WAVE-SHIELDING MATERIAL

CROSS REFERENCE TO RELATED APPLICATION

This application claims the benefits of the priority of Japanese Patent Application No. 2007-148999 filed on Jun. 5, 2007, and the disclosure thereof including the specification and abstract are incorporated herein by reference in its entirety.

BACKGROUND OF THE INVENTION

1. Field of the Invention

The present invention relates to a light-transmitting electromagnetic wave-shielding material, in particular a light-transmitting electromagnetic wave-shielding material having a light interference fringe prevention capability.

2. Description of the Related Art

In these years, there has emerged a big problem that malfunctions or communication failures are caused in machines or electronic devices and apparatuses by electromagnetic waves generated from electronic devices and apparatuses such as personal computers, cellular phones, flat panel displays typified by liquid crystal displays and plasma displays, touch panels, car navigation systems, portable information terminals and portable game machines. Additionally, there has been pointed out a possibility that electromagnetic waves adversely affect human bodies, and hence various countermeasures have been taken with various electromagnetic wave-shielding materials for the purpose of preventing so-called electromagnetic wave interference (hereinafter referred to as EMI).

As base substrates for light-transmitting electromagnetic wave-shielding materials, there are used transparent resin sheets made of resins such as polyethylene terephthalate (PET) resin, polyethylene naphthalate resin, polyester resin and polycarbonate resin. For the purpose of improving mechanical strength and heat resistance, these resins are applied with a stretching treatment in which these resins are uniaxially stretched or biaxially stretched (see Japanese Patent Laid-Open Nos. 2006-157040, 2006-319251, 10-335884 and 10-41682). In the cases where these electromagnetic wave-shielding materials are used in the displays of electronic devices and apparatuses including polarizing plates or retardation plates, there is a problem that when displays are seen through sunglasses, goggles, glare-proof panels or glare-proof window materials having polarizing capability, light interference fringes are generated under the influences of the molecular orientation and the unevenness in the molecular orientation of the base substrates to remarkably degrade the visibility.

SUMMARY OF THE INVENTION

Under such circumstances as described above, there has been demanded the provision of light-transmitting electromagnetic wave-shielding materials undergoing no generation of light interference fringes or undergoing suppressed generation of light interference fringes and being satisfactory in visibility even through sunglasses, goggles, glare-proof panels or glare-proof window materials having polarizing capability.

The present inventors made a diligent study for the purpose of solving the above-described problems, and consequently perfected the present invention by discovering that by using unstretched light-transmitting organic polymer materials low in molecular orientation or small in molecular orientation unevenness as the base substrate of an electromagnetic wave-shielding layer, there are obtained light-transmitting electromagnetic wave-shielding materials excellent in light interference fringe prevention capability. In other words, the present invention relates to a light-transmitting electromagnetic wave-shielding material excellent in light interference fringe prevention capability wherein an unstretched polycarbonate resin is used in the base substrate of the electromagnetic wave-shielding layer.

(1) An embodiment of the present invention is a light-transmitting electromagnetic wave-shielding material having an electromagnetic wave-shielding layer, including an unstretched polycarbonate resin as the base substrate of the electromagnetic wave-shielding layer.

(2) A preferred embodiment of the present invention is the light-transmitting electromagnetic wave-shielding material according to (1), wherein the retardation value of the unstretched polycarbonate resin is 400 nm or less.

(3) Another preferred embodiment of the present invention is the light-transmitting electromagnetic wave-shielding material according to (1), wherein the electromagnetic wave-shielding layer includes a metal thin film mesh or a printed conductive mesh.

(4) Yet another preferred embodiment of the present invention is the light-transmitting electromagnetic wave-shielding material according to (3), wherein the metal thin film mesh or the printed conductive mesh includes a compound containing at least one metal components selected from silver, copper, aluminum, nickel, carbon, ITO, ZnO, tin, zinc, titanium, tungsten and stainless steel.

(5) Sill another preferred embodiment of the present invention is the light-transmitting electromagnetic wave-shielding material according to (1), wherein the electromagnetic wave-shielding capability of the electromagnetic wave-shielding layer is 30 dB or more.

(6) Yet still another preferred embodiment of the present invention is the light-transmitting electromagnetic wave-shielding material according to (1) to be used for a display having a polarizing plate or a retardation plate.

(7) Still yet another preferred embodiment of the present invention is the light-transmitting electromagnetic wave-shielding material according to (1) to be used for a car navigation system or an in-vehicle panel including a polarizing plate or a retardation plate.

The light-transmitting electromagnetic wave-shielding material of a preferred aspect of the present invention does not generate light interference fringes even through sunglasses having polarizing capability or the like and has a satisfactory visibility, and hence is used in a wide range of electromagnetic wave-shielding fields, simultaneously requiring electromagnetic wave-shielding capability, transparency and visibility, such fields involving devices and apparatuses utilizable in vehicles such as car navigation systems, cellular phones, portable information terminals or portable game machines, and further apparatuses used in outdoors such as advertising liquid crystal or plasma displays, displays for automatic vending machines or ticket-vending machines.

DETAILED DESCRIPTION OF THE PREFERRED EMBODIMENTS

Hereinafter, the present invention is described in detail.

A light-transmitting electromagnetic wave-shielding material of the present invention has an electromagnetic wave-shielding layer including an unstretched light-transmitting organic polymer material as a base substrate. In a preferred aspect of the present invention, the electromagnetic wave-shielding layer used in the present invention includes an unstretched light-transmitting polymer material, a conductive compound, or an unstretched light-transmitting polymer material, an adhesive and a conductive compound.

The light-transmitting organic polymer material, used as the base substrate of the present invention from the viewpoint of preventing the generation of light interference fringes, is an unstretched light-transmitting organic polymer low in molecular orientation or small in molecular orientation unevenness. Additionally, from the viewpoint of preventing the generation of light interference fringes and the visibility degradation, the retardation value of the unstretched light-transmitting organic polymer material is preferably 500 nm or less, more preferably 400 nm or less, and furthermore preferably 300 nm or less.

Examples of the unstretched light-transmitting organic polymer material include: polycarbonate resin, polyethylene terephthalate resin, polyester resin, polyether sulfone resin, polyethylene naphthalate resin, polystyrene resin, polyurethane resin, polyvinyl alcohol resin, polymethyl methacrylate resin, alicyclic polyolefin resin, light-transmitting polyimide resin, polyamide resin, acrylic resin, polyacrylonitrile resin, polyvinyl chloride resin, polyvinylidene chloride resin, polypropylene resin and polyethylene resin.

Among these unstretched light-transmitting organic polymer materials, polycarbonate resin is particularly preferable from the viewpoint of transparency, impact resistance and general versatility.

The electromagnetic wave-shielding capability of the electromagnetic wave-shielding layer is preferably 30 dB or more. When the shielding capability is less than 30 dB, the outflow of the electromagnetic waves generated from electronic devices and apparatuses cannot be perfectly prevented and possibly causes the malfunctions and communication failures of other machines and electronic devices and apparatuses, and additionally the electromagnetic waves invading from outside the electronic devices and apparatuses cannot be prevented to possibly damage the electronic devices and apparatuses. In the present invention, no particular constraint is imposed on the upper limit of the electromagnetic wave-shielding capability, the electromagnetic wave-shielding capability may be appropriately selected according to the intended applications, purposes and the like of the light-transmitting electromagnetic wave-shielding materials; when polycarbonate resin is used, usually the electromagnetic wave-shielding capability of approximately 60 dB is feasible.

For the purpose of attaining the above-described electromagnetic wave-shielding capability, the surface resistivity (sheet resistance value) of the electromagnetic wave-shielding layer is preferably 10 $[\Omega/\square]$ or less, more preferably 1 $[\Omega/\square]$ or less and furthermore preferably 0.1 $[\Omega/\square]$ or less.

The conductive compounds forming the electromagnetic wave-shielding layer are not particularly limited as long as such compounds are conductive; however, usable as such compounds are compounds containing at least one metal components selected from the group consisting of iron, gold, silver, copper, aluminum, nickel, carbon, ITO (indium oxide/tin oxide), ZnO (zinc oxide), tin, zinc, titanium, tungsten and stainless steel. From the economic viewpoint, it is preferable to use a conductive compound containing at least one metal components selected from the group consisting of silver, copper, aluminum, nickel, carbon, ZnO (zinc oxide), tin and stainless steel.

In the preferred aspect of the present invention, the electromagnetic wave-shielding layer includes a metal thin film mesh or a printed conductive mesh in which a conductive compound is used. No particular constraint is imposed on the method for fabricating the metal thin film mesh; however, examples of such a method include: (i) a mesh forming method in which on the surface of a film or sheet of a light-transmitting organic polymer material, a metal thin film of copper, silver, aluminum, ITO (indium oxide/tin oxide), ZnO (zinc oxide) or the like is formed by vapor deposition or sputtering; (ii) a mesh forming method in which to the above-described surface, a foil of one of these metals is bonded with an adhesive, and thereafter a mesh is formed by a technique such as etching; (iii) a mesh forming method in which the above-described surface is coated with a plating catalyst-containing ink or paste by means of a printing technique such as gravure printing, ink-jet printing or screen printing, and thereafter a mesh is formed by electroless plating or electrolytic plating; and (iv) a mesh forming method in which a plate of a metal such as copper, silver or aluminum is rolled to a predetermined thickness to yield a metal foil, and then the metal foil is subjected to punching processing to form a mesh. From the viewpoint of water resistance, moisture resistance, corrosion resistance, rust resistance or antireflection, these metal thin film meshes are each preferably subjected to blackening of either one side or both sides thereof. From the viewpoint of electromagnetic wave-shielding capability and transparency, the metal thin film mesh preferably has a line width range from 5 to 200 µm, a thickness range from 0.01 to 100 µm and a pitch range from 100 to 1000 µm.

No particular constraint is imposed on the adhesive for a metal foil to form the metal thin film mesh; heretofore known adhesives or bonding materials satisfactory in transparency, water resistance, moisture resistance and adhesive strength can be used as such an adhesive.

Examples of such adhesives include heretofore known light-curing adhesives, heat-curing adhesives and hot-melt adhesives.

Examples of such usable bonding materials include heretofore known acrylic resin compositions, polyurethane resin compositions, polyester resin compositions, epoxy resin compositions, silicone resin compositions and rubber resin compositions. Most preferable as bonding materials among these compositions are acrylic resin compositions satisfactory in transparency, water resistance, moisture resistance and adhesive strength.

Examples of such hot-melt adhesives include: polyolefin resin compositions such as ethylene-(meth)acrylic acid copolymer resin compositions and ethylene-(meth)acrylic acid ester copolymer resin compositions; polystyrene resin compositions; ethylene vinyl acetate resin compositions; vinyl acetate resin compositions; acrylic resin compositions; polyurethane resin compositions; polyester resin compositions; epoxy resin compositions; polyamide resin compositions; polyvinyl ether resin compositions; silicone resin compositions; and rubber resin compositions. Most preferable as hot-melt adhesives among these compositions are acrylic resin compositions satisfactory in transparency, water resistance, moisture resistance and adhesive strength.

No particular constraint is imposed on the heat-curing adhesives, as long as the heat-curing adhesives are thermally polymerizable. Examples of such heat-curing adhesives include compounds having a functional group such as a glycidyl group, an acryloyl group, a methacryloyl group, a hydroxyl group, a carboxyl group, an isocyanurate group, an amino group or an amide group. These compounds may be used each alone, or also in combinations of two or more thereof. In other words, examples of the heat-curing adhesives include epoxy resin compositions, acrylic resin compositions, silicone resin compositions, phenolic resin compositions, heat-curing polyimide resin compositions, polyurethane resin compositions, polyester resin compositions, melamine resin compositions and urea resin compositions. From the viewpoint of adhesive strength and transparency, preferable are acrylic resin compositions such as epoxy acrylate resin compositions, urethane acrylate resin compositions, polyether acrylate resin compositions and polyester acrylate resin compositions. According to need, these heat-curing adhesives can be used in combinations of two or more thereof. It is also preferable to use curing agents in combination with heat-curing adhesive compositions. As the curing agents, heretofore known curing agents can be used; examples of such curing agents include: isocyanate curing agents; amines such as triethylenetetramine, xylenediamine, N-aminotetramine and diaminodiphenylmethane; acid anhydrides such as phthalic anhydride, maleic anhydride, dodecylsuccinic anhydride, pyromellitic anhydride and benzophenone tetracarboxylic anhydride; and diamino diphenyl sulfone, tris(dimethylaminomethyl)phenol, polyamide resin, dicyan diamide and ethyl methyl imidazole. These curing agents may be used each alone or as mixtures of tow or more thereof.

The light-curing adhesive includes at least one or more (meth)acrylate adhesive compositions selected from a urethane (meth)acrylate adhesive composition, a polyester (meth)acrylate adhesive composition, an epoxy (meth)acrylate adhesive composition and a polyol (meth)acrylate adhesive composition; particularly preferable among these compositions is the urethane (meth)acrylate adhesive composition from the viewpoint of water resistance, moisture resistance, weather resistance, transparency and adhesive strength.

Light-curable (meth)acrylate adhesive compositions that are curable by irradiation with active energy ray are particularly preferable from the viewpoint of the curing time and safety, and visible light or ultraviolet light is preferable as active energy ray.

No particular constraint is imposed on the method for fabricating a printed conductive mesh; however, examples of such a method include a method in which a mesh is formed on the surface of a film or sheet made of a light-transmitting organic polymer material by using an ink or a paste prepared by mixing particles of a compound of a metal such as copper, silver, aluminum or nickel, or carbon with a resin binder such as an epoxy, urethane, acrylic or EVA resin binder, by means of a printing technique such as screen printing, gravure printing or offset printing. From the viewpoint of electromagnetic wave-shielding capability and transparency, the printed conductive mesh preferably has a line width range from 1 to 200 µm, a thickness range from 1 to 100 µm and a pitch range from 100 to 1000 µm.

The light-transmitting electromagnetic wave-shielding material of the present invention is preferably provided with a protective layer disposed on one side of the electromagnetic wave-shielding layer or two protective layers respectively disposed on both sides of the electromagnetic wave-shielding layer, from the viewpoint of the properties such as impact resistance, abrasion resistance, weather resistance, water resistance, moisture resistance, antifogging, antireflection and antistaining. The protective layer may be a film or sheet material made of a light-transmitting glass or an unstretched light-transmitting organic polymer material, or a coating film having various functions, as long as the protective layer is made of a visibility-ensuring and light-transmitting material.

In the unstretched light-transmitting organic polymer material used in the protective layer, included are adhered, vapor deposited, coated, printed and processed materials made of various metal compounds, conductive compounds, organic compounds and inorganic compounds. Examples of the unstretched light-transmitting organic polymer materials include polycarbonate resin, polyethylene terephthalate resin, polyester resin, polyether sulfone resin, polyethylene naphthalate resin, polystyrene resin, polyurethane resin, polyvinyl alcohol resin, polymethyl methacrylate resin, alicyclic polyolefin resin, light-transmitting polyimide resin, polyamide resin, acrylic resin, polyacrylonitrile resin, polyvinyl chloride resin, polyvinylidene chloride resin, polypropylene resin and polyethylene resin.

Particularly preferable among these unstretched light-transmitting organic polymer materials is polycarbonate resin from the viewpoint of transparency, impact resistance and general versatility.

No particular constraint is imposed on the coating film; however, preferable for the coating film are silicone resin compounds excellent in long term durability and relatively high in surface hardness, or acrylic resins or multifunctional acrylic resins relatively simple in treatment and capable of forming satisfactory coating films. The curing process of these coating films depends on the properties of the resin compound used; however, in consideration of productivity and simplicity, it is preferable to select a heat-curing or light-curing resin. Examples of the light-curing resin include, as an example, a resin composition prepared by adding a photopolymerization initiator as a curing catalyst to a resin composition including a single monofunctional or multifunctional acrylate monomer, oligomer or the like, or to a resin composition including a plurality of monofunctional or multifunctional acrylate monomers, oligomers or the like. Examples of the heat-curing resin include polyorganosiloxane resins and crosslinking acrylic resins. Such resin compositions are commercially available as hard coating agents, and appropriate hard coating agents may be selected in consideration of the compatibility with the film coating line.

To these coating films, an ultraviolet absorber, a light stabilizer and an antioxidant, and additionally, according to need, an organic solvent, various stabilizers such as a color protection agent, a leveling agent, an antifoaming agent, a thickener, an antistatic agent, and surfactants such as an antifogging agent may be appropriately added.

The light-transmitting electromagnetic wave-shielding material of the present invention is preferably provided with a grounding member in an appropriate manner, for the purpose of fully displaying the shielding capability thereof and preventing the leakage of electromagnetic waves. No particular constraint is imposed on the method for providing a grounding member; however, examples of such a method include: a method in which a conductive paste, prepared by mixing particles of a compound of a metal such as copper, silver, aluminum or nickel, or carbon with a resin binder such as an epoxy, urethane, acrylic or EVA resin binder, is applied to the periphery of the edge faces of the light-transmitting electromagnetic wave-shielding material; a method in which the periphery of the edge faces of the light-transmitting electromagnetic wave-shielding material is covered with a conductive tape; and a method in which these two methods are combined. It is preferable to cover 70% or more of the periphery of the edge faces with the conductive paste or the conductive tape.

The light-transmitting electromagnetic wave-shielding material of the present invention preferably includes an ultraviolet absorber, a light stabilizer and an antioxidant in the members thereof such as the electromagnetic wave-shielding layer, the protective layer and the adhesive layer, for the purpose of preventing the aging due to the hydrolysis and oxidation and the degradation due to ultraviolet light of the laminated light-transmitting organic polymer material itself, and improving the heat resistance and the weather resistance of the laminated light-transmitting organic polymer material itself, under the severe conditions of being exposed to sunlight and to wind and rain. From the viewpoint of cost, it is preferable to form a coating film including at least one of an ultraviolet absorber, a light stabilizer and an antioxidant on either one side or both sides of the light-transmitting electromagnetic wave-shielding laminate.

Preferable for the coating film are silicone resin compounds excellent in long term durability and relatively high in surface hardness, or acrylic resins or multifunctional acrylic resins relatively simple in treatment and capable of forming satisfactory coating films. The curing process of these coating films depends on the properties of the resin compound used; however, in consideration of productivity and simplicity, it is preferable to select a heat-curing or light-curing resin. Examples of the light-curing resin include, as an example, a resin composition in which a photopolymerization initiator is added as a curing catalyst to a resin composition including a single monofunctional or multifunctional acrylate monomer, oligomer or the like, or to a resin composition including a plurality of monofunctional or multifunctional acrylate monomers, oligomers or the like. Examples of the heat-curing resin include polyorganosiloxane resins and crosslinking acrylic resins. Such resin compositions are commercially available as hard coating agents, and appropriate hard coating agents may be selected in consideration of the compatibility with the film coating line.

To these coating films, the above-described ultraviolet absorber, light stabilizer and antioxidant, and additionally, according to need, an organic solvent, various stabilizers such as a color protection agent, a leveling agent, an antifoaming agent, a thickener, an antistatic agent, and surfactants such as an antifogging agent may be optionally added.

Additionally, the coating film may also be formed as a coating film formed on the acrylic resin layer laminated on a substrate by the coextrusion of the substrate and the acrylic resin, conducted for the purpose of improving the adhesion of the light-transmitting electromagnetic wave-shielding laminate to the substrate.

Examples of the coating film including a light-curing acrylic resin compound include, as an example, a composition for use in an ultraviolet light-curable resin coating film wherein the composition includes a photopolymerizable compound composed of 20 to 80% by weight of 1,9-nonanediol diacrylate or tris(acroxyethyl)isocyanurate and 20 to 80% by weight of another compound copolymerizable with this diacrylate or this isocyanurate, and 1 to 10% by weight of a photopolymerization initiator is added to the photopolymerizable compound.

In the present invention, examples of the method for coating the light-transmitting electromagnetic wave-shielding material with a coating film include the methods utilizing a brush, a roll, dipping, flow coating, a spray, a roll coater and a flow coater. The thickness of the coating film cured by heat curing or light curing is 1 to 20 µm, preferably 2 to 15 µm and more preferably 3 to 12 µm. When the thickness of the coating film is less than 1 µm, the improvement effects of the weather resistance and the surface hardness tend to be insufficient, and on the other hand, also when the thickness concerned exceeds 20 µm, disadvantage in cost is caused, and the impact resistance tends to be degraded as the case may be.

EXAMPLES

Hereinafter, specific description is made on the present invention, in particular, on the embodiments and advantageous effects of the present invention with reference to Examples and Comparative Examples. However, the present invention is not limited at all by these examples. The evaluation results described in Examples and Comparative Examples were measured according to the following test methods.

(Retardation Value [Re])

Retardation values were measured with an ellipsometer (ELP-200ADT, manufactured by Mizojiri Optical Co., Ltd.) at a measurement wavelength (λ) of 632.8 nm.

(Light Interference Fringe Protection Capability Test)

A light-transmitting electromagnetic wave-shielding material was disposed on the front face of a liquid crystal display including a polarizing plate or a retardation plate, and occurrence/nonoccurrence of the generation of light interference fringes was visually evaluated through sunglasses having polarizing capability.

[Visual Evaluation]

("A"): No light interference fringes are identified, without any changes found.

("B"): Light interference fringes are slightly generated, with visibility.

("C"): Light interference fringes are generated, with remarkable degradation of visibility.

(Electromagnetic Wave-Shielding Capability Test)

Electromagnetic wave-shielding capability was measured with an electromagnetic wave-shielding capability measurement apparatus (manufactured by Advantest Corporation) over a frequency range from 100 MHz to 1 GHz.

[Electromagnetic Wave-Shielding Capability Evaluation]

A case where the electromagnetic wave-shielding capabilities at 100 MHz and 1 GHz were 30 dB or more was evaluated as pass ("A") and a case where less than 30 dB was evaluated as fail ("C").

Referential Example 1

A 12-µm thick copper foil was bonded to an unstretched polyethylene terephthalate (PET) film (100 µm in thickness), through the intermediary of an acrylic adhesive film (Pyralux LF-0200, manufactured by DuPont Corporation). The obtained PET film with copper foil was subjected to a photolithography process (including bonding of a resist film, exposure, development, chemical etching and resist film peeling off) to form a copper thin film mesh of 20 µm in line width and 500 µm in line intervals on the PET film, and thus a sample was obtained.

Various evaluations were conducted to give the following results: the retardation value (Re) was found to be 300 nm; according to the above-described "electromagnetic wave-shielding capability test," the electromagnetic wave-shielding capability of the sample was found to be satisfactory; and in the above-described "light interference fringe prevention capability test," the sample was found to be free from generation of light interference fringes and satisfactory in visibility. However, an unstretched polyethylene terephthalate (PET) film exhibits poor heat resistance and strength due to low crystallinity.

Example 1

A 12-µm thick copper foil was bonded to an unstretched polycarbonate (PC) film (100 µm in thickness, manufactured by MGC Filsheet Co., Ltd.), through the intermediary of an acrylic adhesive film (Pyralux LF-0200, manufactured by DuPont Corporation). The obtained PC film with copper foil was subjected to a photolithography process (including bonding of a resist film, exposure, development, chemical etching and resist film peeling off) to form a copper thin film mesh of 20 μm in line width and 500 μm in line intervals on the PC film, and thus a sample was obtained.

Various evaluations were conducted to give the following results: the retardation value (Re) was found to be 20 nm; according to the above-described "electromagnetic wave-shielding capability test," the electromagnetic wave-shielding capability of the sample was found to be satisfactory; and in the above-described "light interference fringe prevention capability test," the sample was found to be free from generation of light interference fringes and satisfactory in visibility.

Example 2

A 3-μm thick aluminum foil was bonded to an unstretched polycarbonate (PC) film (100 μm in thickness, manufactured by MGC Filsheet Co., Ltd.), through the intermediary of an acrylic adhesive film (Pyralux LF-0200, manufactured by DuPont Corporation). The obtained PC film with aluminum foil was subjected to a photolithography process (including bonding of a resist film, exposure, development, chemical etching and resist film peeling off) to form an aluminum thin film mesh of 20 μm in line width and 500 μm in line intervals on the PC film, and thus a sample was obtained.

Various evaluations were conducted to give the following results: the retardation value (Re) was found to be 20 nm; according to the above-described "electromagnetic wave-shielding capability test," the electromagnetic wave-shielding capability of the sample was found to be satisfactory; and in the above-described "light interference fringe prevention capability test," the sample was found to be free from generation of light interference fringes and satisfactory in visibility.

Example 3

By using a mask layer, an electroless plating nickel thin film was formed in a grid pattern on an unstretched polycarbonate (PC) film (100 μm in thickness, manufactured by MGC Filsheet Co., Ltd.) to form a nickel thin film mesh of 10 μm in line width, 500 μm in line intervals and 3 μm in line thickness on the PC film, and thus a sample was obtained.

Various evaluations were conducted to give the following results: the retardation value (Re) was found to be 20 nm; according to the above-described "electromagnetic wave-shielding capability test," the electromagnetic wave-shielding capability of the sample was found to be satisfactory; and in the above-described "light interference fringe prevention capability test," the sample was found to be free from generation of light interference fringes and satisfactory in visibility.

Example 4

By using a conductive AgC paste, on an unstretched polycarbonate (PC) film (100 μm in thickness, manufactured by MGC Filsheet Co., Ltd.), a printed conductive mesh of 100 μm in line width, 500 μm in line intervals and 10 μm in line thickness was formed by screen printing, and thus a sample was obtained.

Various evaluations were conducted to give the following results: the retardation value (Re) was found to be 20 nm; according to the above-described "electromagnetic wave-shielding capability test," the electromagnetic wave-shielding capability of the sample was found to be satisfactory; and in the above-described "light interference fringe prevention capability test," the sample was found to be free from generation of light interference fringes and satisfactory in visibility.

Comparative Example 1

A 12-μm thick copper foil was bonded to a biaxially stretched polyethylene terephthalate (PET) film (38 μm in thickness, Ester E5100, manufactured by Toyobo Co., Ltd.), through the intermediary of an acrylic adhesive film (Pyralux LF-0200, manufactured by DuPont Corporation). The obtained PET film with copper foil was subjected to a photolithography process (including bonding of a resist film, exposure, development, chemical etching and resist film peeling off) to form a copper thin film mesh of 20 μm in line width and 500 μm in line intervals on the PET film, and thus a sample was obtained.

Various evaluations were conducted to give the following results: the retardation value (Re) was found to be 6000 nm; according to the above-described "electromagnetic wave-shielding capability test," the electromagnetic wave-shielding capability of the sample was found to be satisfactory; and in the above-described "light interference fringe prevention capability test," the sample was found to undergo generation of light interference fringes and to be remarkably degraded in visibility.

Comparative Example 2

A 12-μm thick copper foil was bonded to a uniaxially stretched polyethylene terephthalate (PET) film (38 μm in thickness, Ester K1581, manufactured by Toyobo Co., Ltd.), through the intermediary of an acrylic adhesive film (Pyralux LF-0200, manufactured by DuPont Corporation). The obtained PET film with copper foil was subjected to a photolithography process (including bonding of a resist film, exposure, development, chemical etching and resist film peeling off) to form a copper thin film mesh of 20 μm in line width and 500 μm in line intervals on the PET film, and thus a sample was obtained.

Various evaluations were conducted to give the following results: the retardation value (Re) was found to be 3000 nm; according to the above-described "electromagnetic wave-shielding capability test," the electromagnetic wave-shielding capability of the sample was found to be satisfactory; and in the above-described "light interference fringe prevention capability test," the sample was found to undergo generation of light interference fringes and to be remarkably degraded in visibility.

Comparative Example 3

A 12-μm thick copper foil was bonded to a biaxially stretched polycarbonate (PC) film (100 μm in thickness), through the intermediary of an acrylic adhesive film (Pyralux LF-0200, manufactured by DuPont Corporation). The obtained PC film with copper foil was subjected to a photolithography process (including bonding of a resist film, exposure, development, chemical etching and resist film peeling off) to form a copper thin film mesh of 20 μm in line width and 500 μm in line intervals on the PC film, and thus a sample was obtained.

Various evaluations were conducted to give the following results: the retardation value (Re) was found to be 7000 nm; according to the above-described "electromagnetic wave-shielding capability test," the electromagnetic wave-shielding capability of the sample was found to be satisfactory; and in the above-described "light interference fringe prevention capability test," the sample was found to undergo slight generation of light interference fringes and to be degraded in visibility.

TABLE 1

| | Light-transmitting electromagnetic wave-shielding material | | | | | | Retardation value [λ = 632.8 nm] [nm] | Light interference fringe prevention capability Pass/fail | Shielding capability Pass/fail |
|---|---|---|---|---|---|---|---|---|---|
| | | Electromagnetic wave-shielding mesh | | | | | | | |
| | Base substrate | Electromagnetic wave-shielding layer | Conductive compound | Line width (μm) | Line interval (μm) | Line thickness (μm) | | | |
| Referential Example 1 | Unstretched PET | Metal thin film mesh | Copper | 20 | 500 | 12 | 300 | A | A |
| Example 1 | Unstretched PC | Metal thin film mesh | Copper | 20 | 500 | 12 | 20 | A | A |
| Example 2 | Unstretched PC | Metal thin film mesh | Aluminum | 20 | 500 | 3 | 20 | A | A |
| Example 3 | Unstretched PC | Metal thin film mesh | Nickel | 10 | 500 | 3 | 20 | A | A |
| Example 4 | Unstretched PC | Printed conductive mesh | AgC paste | 100 | 500 | 10 | 20 | A | A |
| Comparative Example 1 | Biaxially stretched PET | Metal thin film mesh | Copper | 20 | 500 | 12 | 6000 | C | A |
| Comparative Example 2 | Uniaxially stretched PET | Metal thin film mesh | Copper | 20 | 500 | 12 | 3000 | C | A |
| Comparative Example 3 | Biaxially stretched PC | Metal thin film mesh | Copper | 20 | 500 | 12 | 7000 | C | A |

The light-transmitting electromagnetic wave-shielding material of the present invention is used in a wide range of electromagnetic wave-shielding fields involving devices and apparatuses utilizable in vehicles such as car navigation systems, cellular phones, portable information terminals or portable game machines, and further apparatuses used in outdoors such as advertising liquid crystal or plasma displays, displays for automatic vending machines or ticket-vending machines.

What is claimed is:

1. A light-transmitting electromagnetic wave-shielding material having an electromagnetic wave-shielding layer which shields electromagnetic waves generated from electronic devices and apparatuses, comprising an unstretched polycarbonate resin as a base substrate of the electromagnetic wave-shielding layer;
wherein a retardation value of the unstretched polycarbonate resin is 400 nm or less.

2. The light-transmitting electromagnetic wave-shielding material according to claim 1, wherein the electromagnetic wave-shielding layer comprises a metal thin film mesh or a printed conductive mesh.

3. The light-transmitting electromagnetic wave-shielding material according to claim 2, wherein the metal thin film mesh or the printed conductive mesh comprises a compound including at least one metal components selected from silver, copper, aluminum, nickel, carbon, ITO, ZnO, tin, zinc, titanium, tungsten and stainless steel.

4. The light-transmitting electromagnetic wave-shielding material according to claim 1, wherein an electromagnetic wave-shielding capability of the electromagnetic wave-shielding layer is 30 dB or more.

5. The light-transmitting electromagnetic wave-shielding material according to claim 1 included in a display having a polarizing plate or a retardation plate.

6. The light-transmitting electromagnetic wave-shielding material according to claim 1 included in a car navigation system or an in-vehicle panel comprising a polarizing plate or a retardation plate.

* * * * *